United States Patent [19]

Collins et al.

[11] Patent Number: 4,910,436

[45] Date of Patent: * Mar. 20, 1990

[54] WIDE AREA VUV LAMP WITH GRIDS AND PURGING JETS

[75] Inventors: George J. Collins; Zeng-qi Yu; Tien-yu Sheng, all of Ft. Collins, Colo.

[73] Assignee: Applied Electron Corporation, Santa Clara, Calif.

[*] Notice: The portion of the term of this patent subsequent to Nov. 1, 2005 has been disclaimed.

[21] Appl. No.: 155,235

[22] Filed: Feb. 12, 1988

[51] Int. Cl.$^4$ .................. C03C 13/08; B05D 3/06; H05H 1/02

[52] U.S. Cl. .............. 315/111.81; 315/111.21; 313/231.61; 313/362.1; 204/164; 118/50.1

[58] Field of Search .......... 315/111.01, 111.31, 315/111.21, 111.71, 111.81, 111.91; 313/231.31, 231.71, 362.1, 637; 204/164; 118/50.1, 620, 723

[56] References Cited

U.S. PATENT DOCUMENTS

| | | | |
|---|---|---|---|
| 3,760,225 | 9/1973 | Ehlers et al. | 315/111.31 X |
| 3,989,975 | 11/1976 | Trotel | 313/231.31 |
| 4,442,383 | 4/1984 | Hill | 313/362.1 X |
| 4,509,451 | 4/1985 | Collins et al. | 118/50.1 |
| 4,523,971 | 6/1985 | Cuomo et al. | 118/50.1 X |
| 4,664,747 | 5/1987 | Sekiguchi et al. | 118/50.1 X |
| 4,716,491 | 12/1987 | Ohno et al. | 315/111.71 X |
| 4,737,688 | 4/1988 | Collins et al. | 315/111.21 |
| 4,782,267 | 11/1988 | Collins et al. | 313/637 X |

FOREIGN PATENT DOCUMENTS 0276822 12/1987 Japan ................... 313/231.31

Primary Examiner—Eugene R. LaRoche
Assistant Examiner—Seung Ham
Attorney, Agent, or Firm—William E. Hein

[57] ABSTRACT

A disc-shaped plasma, generated by a ring-shaped cold cathode is used both as an in-situ large area (10–20 cm in diameter) VUV lamp and as a source of ground state and excited atoms. The atoms created in the disc-shaped plasma may be used for initiating sensitized atom-molecule reactions in the volume that dissociate the molecules as well as for providing external energy to heterogenous surface reactions. Multiple grid electrodes are used to extract ions or electrons from the plasma during the deposition process. The disc-shaped plasma is of narrow width which is optically thin for resonance photons emitted in a direction perpendicular to the disc to minimize undesired resonance trapping and associated line reversal. This VUV lamp operates without the need for optical windows; hence, ground state and excited atoms, created in the disc-shaped plasma, can diffuse from the disc-shaped plasma toward the substrate.

10 Claims, 2 Drawing Sheets

WIDE AREA VUV LAMP WITH GRIDS AND PURGING JETS

REFERENCE TO RELATED APPLICATION AND PATENT

This application is related to the subject matter of U.S. patent application Ser. No. 827,336 entitled In-Situ Wide Area Vacuum Ultraviolet Lamp filed Feb. 7, 1986, by George J. Collins et al. and to U.S. Pat. Ser. No. 4,509,451 entitled Electron Beam Induced Chemical Vapor Deposition. The subject matter of the foregoing application and patent is incorporated herein by reference.

BACKGROUND AND SUMMARY OF THE INVENTION

The present invention is directed to a new source of VUV radiation and atomic radicals for chemical vapor deposition and growth of thin films at lower substrate temperatures than those required using pure thermal methods and with less radiation damage than conventional plasma means. The in-situ vacuum ultraviolet (VUV) lamp of the present invention can be located directly inside a processing chamber for use in photodissociating feedstock molecules and providing external energy to assist surface reactions. The in-situ VUV lamp, excited by the ring-shaped cold cathode of the present invention, can also provide a source of excited and ground state neutral atoms that may participate in sensitized atom-molecule dissociation reactions. The feedstock reactant molecules dissociated by VUV radiation and by sensitized reactions have products used for deposition, growth, etching, doping or polymerization of microelectronic films.

This in-situ source of both VUV photons and atomic species with large open area is made possible by a ring-shaped cold cathode geometry, without a center anode, which permits formation of a disc-shaped trapped electron beam. The disc-shaped trapped electron beam created plasma contains high energy electrons which are trapped within the ring-shaped cold cathode by electrostatic reflection. The spatial width of this electron beam created plasma may be kept below several millimeters, thereby allowing for much reduced radiation trapping of resonant radiation emitted since the absorption length of a resonant photon is less than or comparable to the width of the electron beam created plasma rather than greater than the plasma width as in conventional lamps. The high electron energy plasma efficiently generates both VUV radiation and atomic species, in a low pressure molecular gas such as deuterium, oxygen, hydrogen or nitrogen. The VUV radiation emitted from this disc-shaped trapped electron beam plasma occurs over a large area, typically 5 to 20 centimeters in diameter. No VUV windows are required for this lamp design. Radiation trapping effects, if present at all, will result in a diffuse volume of self-absorbed VUV radiation surrounding the disc-shaped plasma region. The VUV radiation will be used for photon assisted processing of microelectronic, photovoltaic, optical, and electro-optic films. A number of auxiliary grid electrodes are combined with the ring-shaped cold cathode to inhibit charged particles generated within the disc-shaped electron beam plasma from bombarding the processed sample when surface damage is undesirable. Alternatively, energetic electrons generated within the disc-shaped electron beam plasma can be purposely steered toward the processed substrate, thereby heating the surface, to enhance surface mobility of adsorbed species and thereby increase deposited or grown film density and reduce the number of pinholes in the film.

There is increased interest in low temperature and low radiation damage fabrication methods for use in III-V, II-VI and Si semiconductor processing, as well as for coating temperature sensitive materials such as heavy metal fluoride glasses. Vacuum ultraviolet photon assisted chemical vapor deposition (VUV-CVD) is one promising low temperature process used successfully to deposit metals, insulators and semiconducting films. The photon energies associated with commercially available laser and lamp photon sources, 4 to 7 eV, are in some cases inadquate for directly dissociating some feedstock reactant gases. The photon absorption cross sections of many polyatomic reactant gases used in CVD processes have peak photon absorption values in the vacuum ultraviolet (VUV) region beyond the reach of commercial photon sources. Photo deposition of hydrogenated amorphous silicon, for example, requires a VUV light source when using monosilane as a feedstock gas since monosilane does not absorb photons with wavelengths above 190 nm. The present invention of a cold cathode electron gun excited lamp provides an in-situ large area vacuum ultraviolet light source as well as a source of ground and excited atomic gas species. Illustrative gases well suited to operation with cold cathode electron guns are atomic helium, molecular hydrogen, molecular oxygen, and molecular nitrogen. Both VUV photons and atomic radicals are available in electron beam excited He, $N_2$, $O_2$ or $H_2$ plasmas and may be used to assist low temperature chemical vapor deposition, the growth of thin films on substrates, and the passivation of crystalline defects in epitaxial films or bulk wafers. The hydrogenation of previously deposited polysilicon for use in thin film transistors is a specific example of the use of VUV photons and atomic radicals. For example, see Nakazawa et al., Applied Physics Letters vol. 51 pp. 1623–1625 (1987).

A ring shaped cold cathode creates beam electrons that are injected into the ambient gas to sustain a spatially confined disc-shaped electron beam plasma. The VUV photons, ground state atoms and excited gas species generated by the disc-shaped electron beam plasma, can initiate and sustain both gas phase homogeneous and surface induced heterogeneous chemical reactions. In the present invention control grids and purging gas jets serve to enhance the performance of the VUV and atomic radical source, especially for applications over a much wider area and when using hydrogen, nitrogen, oxygen, and helium feedstock gases. Such applications include polymer processing, film deposition, epitaxial film growth, and defect passivation of hetero-epitaxial films.

Photo-exposure, decomposition, and cross-linking of polymer materials all require an ultraviolet or vacuum ultraviolet light source of wide area to activate photochemical reactions in the polymer film. First layer resist hardening may, for example, be accomplished for use in multi-layer resist processing, thereby eliminating undesired reflow that occurs in unhardened layers when exposed to elevated temperatures. Photo-assisted chemical vapor deposition, photo-assisted etching, and photo-assisted growth of organic or inorganic based microelectronic, photovoltaic, and electro-optic films may also require a wide area VUV light source to dissociate feedstock reactant gases and thereby promote both rapid and low temperature processing. Compared to plasma processing, photon processing achieves the same reduction in the process temperature via input of external energy but with substantially less radiation damage since no electric fields are applied to the substrate.

There is a strong need for UV and VUV light sources of wide area in all of these photo-assisted process applications. Of special interest are wide area VUV lamps providing both a source of photons as well as a source of ground state and excited atomic species that are swept out of the active plasma and sent toward the substrate. The excited and radical species, created in the electron beam plasma, diffuse across a boundary layer to interact with the substrate. Sensitized atom-film reactions and VUV impingement on the film both assist heterogeneous surface reactions. There is no need for any external fields on the substrate being processed. All such fields are localized to the cold cathode electron gun excited lamp. The vacuum ultraviolet photons and gas sensitized reactions can also cause homogeneous reactant dissociation via volume photo-absorption and sensitized gas collisions, respectively. In the case of film deposition, nucleation occurs at selective adsorption sites on the substrate, leading to the formation of islands and finally, as growth proceeds through coalescence, a uniform film is created. VUV photons and sensitized excited atom collisions occurring at the surface will aid initial and intermediate stages of film deposition or growth, allow endothermic chemical reactions to occur, and increase surface mobility at lower substrate temperatures than possible with conventional pure thermal methods. The above low temperature growth or deposition also occurs with less radiation damage than that from conventional plasma assisted methods.

The in-situ VUV lamp of the present invention, when working with molecular $D_2$, $H_2$, $O_2$, or $N_2$ gas, also acts as a dissociation source for producing atomic deuterium, hydrogen, oxygen or nitrogen. The numerous ground state atomic hydrogen, oxygen, or nitrogen atoms that diffuse far (1-10 centimeters) from the confined disc-shaped beam of electrons can subsequently be pumped up to excited neutral levels following absorption of resonance radiation emitted from the plasma disc. VUV optical pumping of atomic ground state atoms raises their internal energy and allows them to participate in sensitized atom-molecule collisions which dissociate the reactant organic or inorganic polyatomic feedstock gas molecules either in the plasma volume or at the substrate surface. The present in-situ VUV lamp will run in $D_2$, $H_2$, $N_2$, $O_2$, and helium background gas pressures from 0.03 to 30 Torr as well as in mixtures of these background gases.

Examples of possible types of film deposition with the new VUV photon and free radical assisted deposition technique include: semiconductors, such as doped and undoped amorphous silicon, polycrystalline or epitaxial silicon; III-V materials such as gallium arsenide or In-GaAs; insulators, such as silicon dioxide, aluminum nitride, silicon nitride, gallium nitride; crystalline diamond or diamond-like carbon films; and metallic conductors such as tungsten, aluminum, Al-Si or metallic silicides. Each deposited film's constituent atoms are introduced into the vapor phase by use of a specific feedstock reactant gas. For example, the gas molecules used in the deposition of $SiO_2$ and $Si_3N_4$ films include silane as a silicon donor and $N_2O$ as an oxygen donor or ammonia as a nitrogen donor, respectively.

An additional application of this VUV and free radical assisted processing is an enhanced low temperature growth, as opposed to deposition, of native films of various materials. Illustrative examples include $Si_3N_4$, SiC and $SiO_2$ grown on Si. In this case, a feedstock gas compound reacts with the silicon substrate, assisted by VUV radiation and energetic free radicals provided by the new wide area source to assist formation of the desired silicon compounds at lower substrate temperatures than is possible without the external VUV and free radical energy. Again, this is accomplished with reduced radiation damage from ions or electrons that would be found in conventional plasma processing. A specific example of a native film growth is silicon dioxide ($SiO_2$) on bare silicon wafers assisted by the absorption of VUV radiation by the oxygen containing feedstock gases and the creation of excited molecular and atomic oxygen species which diffuse into the growing $SiO_2$ layer and oxidize the silicon in the substrate. Low temperature nitridation of $SiO_2$ films, such as gate oxides, may also be accomplished by creation of excited nitrogen species to form a thin silicon nitride or oxynitride layer with minimum radiation damage.

Thin crystalline III-V layers can be grown directly on Si substrates but the control of heteroepitaxial conditions is still problematic especially for minority carrier devices. The two semiconductor materials have a physical mismatch between the lattice spacings, polar versus non-polar interface characteristics, and disparate temperature coefficients of expansion, all of which limit crystal quality via bulk crystalline defects and the presence of undesired surface states. Low temperature (300-400 degrees C.) atomic hydrogen assisted III-V film depositions will achieve lower defect material GaAs on Si than that obtained by thermal MOCVD. This occurs as the result of both lower deposition temperature and the beneficial effects of hydrogen on the different thermal expansion coefficients.

Prior work on the role of atomic hydrogen in MOCVD is varied. Much of this work emphasized post-deposition hydrogenation. However, the role of atomic hydrogen exchange from hydrides to organometallic molecules in decomposition reactions and formation of stable hydrocarbons has been recently studied by Mashita (J. Crystal Growth vol. 77, pp. 194 1986). Atomic hydrogen also aids donor and EL2 defect passivation following the work of Deutramont-Smith (Appl. Phys. Letters vol. 49, p. 1098 1986).

Initial exposure of the silicon substrate to arsenic containing gas, when done on a reconstructed surface, passivates the Si surface to avoid growth of undesired anti-phase boundaries. Indeed, much of the present success of GaAs heteroepitaxy on Si may be attributed to initial nucleation of the surface with arsenic. Alternatively, gallium passivated surfaces may be the most appropriate due to the high sublimation (gasification) rate in atomic hydrogen environments of arsenic. When the silicon surface is nucleated with only one element of the III-V compound and continued growth of the GaAs ensues, a highly charged interface results. Intense fields are created by the excess charge associated with the Ga-Si, Ga-As, and the As-Si bonds at the interface. This electrical field causes rearrangement of the interface material or compensation of the charge occurs through undesired defect generation. It has been shown that with the initial nucleation with gallium, the arsenic diffuses through this first layer to bond with the silicon. This arrangement, as reported by Kreomer (J. Crystal Growth vol. 81, p. 193 1987) may also be the reason for the diffusion of the Si into the GaAs thin film.

Arsenic passivation via dangling bond satisfaction with atomic hydrogen is achieved in order to reduce the interdiffusion of the Si into the GaAs by reducing the intense electrical fields that are created at the GaAs to Si interface in conventional processing. The specific process methodology uses excess atomic hydrogen and only gallium feedstock gas. Gallium nucleation on Si at the early stage of GaAs growth causes an interfacial excess negative charge created by the Ga-Si bond. Arsenic passivation via dangling bond satisfaction with atomic hydrogen may also reduce the interdiffusion of the Si into the GaAs by reducing the intense electrical fields that are created. In the early stages of growth, the atomic hydrogen species so created by the disc plasma will be used for passivation of the charge created at the III-V/Si interface by the polar on non-polar deposition. Hydrogenation provides for the passivation of the excess electrons that are formed in the creation of these bonds. Atomic hydrogen charge compensation of the interface could be done without degradation of the initial gallium or arsenic layer. The above process requires the unique VUV open structure lamp taught in accordance with the present invention.

The "windowless" lamps of the present invention with grids and purging jets have three major advantages in VUV-MOCVD or sensitized reaction MOCVD processes: (1) they provide a large area VUV photon source but they do not require VUV windows, rather a transparent metal mesh or an open disc may be used; (2) they allow for unimpeded flow of atomic species, created following electron impact dissociation of molecules in the plasma into the reaction chamber which can initiate a sensitized atom-molecule reaction, that is, atomic hydrogen is used for dissociating metal-organic molecules; (3) atomic hydrogen may be used for passivating GaAs-Si interfacial charges and for reducing residual carbon in the deposited film. All reactant gases are introduced at low partial pressures compared to the background hydrogen so that sputtering of the ring-shaped cold cathode is minimized. Inert gas or hydrogen purging in the disc-shaped electron beam plasma volume or near the ring-shaped cold cathode surface is also helpful for increasing operation stability of the disc-shaped electron beam plasma via in-situ discharge cleaning of the cathode surface.

Conventional VUV light sources include both high pressure and low pressure gas discharge lamps. These lamps are excited by either a radio frequency, microwave, or D.C. electrical source. A VUV transmitting window, such as $MgF_2$, $LiF_2$, sapphire, or $CaF_2$ is used in these lamps to transmit the VUV resonance light generated in the enclosed plasma. The prior listed window materials are hydroscopic, their VUV transmission degrades the time and VUV exposure, and the windows are expensive. Conventional VUV light sources also include hollow cathode lamps with or without VUV windows. Such hollow cathode lamps are usually cylindrical rather than disc-like lamps and have a small circular area ($<3$ $cm^2$) with an optically thick plasma that traps resonance radiation. Finally, the hollow cathode discharge is usually a closed wall structure that substantially prevents outdiffusion toward the substrates of atomic species and free radicals created in the plasma region.

The need for a VUV window having a high optical transmission characteristic, the additional need for a source of excited atomic species, and the creation of wide area illumination of disc-like geometry in the VUV spectral region are all major problems not addressed in the conventional VUV lamp art. Conventional lamps then employ both VUV windows and enclosure walls to maintain the specific lamp gases at the required pressure within the lamp. These features inhibit or prevent the diffusion of atomic or molecular free radicals from the localized plasma region into the microelectronic electrooptic processing chamber, especially over a wide area. VUV lamps having diameters equal to or greater than 2-5 centimeters are simply not possible using previous gas discharge methods described above. Hence, they can directly illuminate only a portion of a 5-20 centimeter diameter substrate used in silicon or III-V microelectronics manufacture. This wide area processing requirement is greater for large area solar cells or flat panel displays since geometries often exceed 1000 $cm^2$ in area.

Conventional enclosed VUV lamps using $D_2$ or $H_2$, for example, as a gaseous medium only create VUV radiation. They do not create and allow atomic hydrogen or atomic deuterium in ground or excited states to diffuse unimpeded from the lamp plasma into the region surrounding. Coventional lamps have walls and windows that are not open in structure as is the case for the ring-shaped cold cathode structure taught in accordance with the present invention. Hence, diffusion of atomic species from the plasma cannot occur over a wide area, if at all, for closed wall conventional VUV lamps. As emphasized in the process of the present invention, these atomic species can be used very efficiently both in sensitized atom-molecule reactions to cause dissociation of the feedstock reactant gases or to assist surface chemical reactions on substrates by providing a source of external energy.

The use of significant amounts of atomic hydrogen is known to facilitate the growth of crystalline diamond via both gas-solid heterogenous chemistry as well as by gas phase homogenous chemistry. What defines a significant amount of atomic hydrogen has not been adequately defined in the literature. However, the need of atomic hydrogen is well known. Reactant gases used in carbon and diamond film deposition processes may comprise various hydrocarbons such as $CH_4$, $C_2H_6$, MMA, etc. The VUV radiation from D (121.5 nm), H (121.6 nm), 0 (130 nm), He+ (122 nm) and He (58 nm) is able to directly photo-dissociate polyatomic feedstock molecules, such as $CH_4$ and $C_2H_6$ which absorb strongly only in the VUV region and absorb very little in the ultraviolet region and are used to deposit crystalline diamond or diamond-like films. It is noteworthy that using the in-situ VUV lamp of the present invention as compared to conventional lamps for the deposition of diamond-like carbon films is unique because deep VUV photons ($<75$ nm), atomic hydrogen, and energetic electrons are all provided by this in-situ VUV lamp with external grids. The grids permit better independent control of relative amounts of energetic electrons impinging on the substrate.

DESCRIPTION OF THE PREFERRED EMBODIMENT

Figure 1:
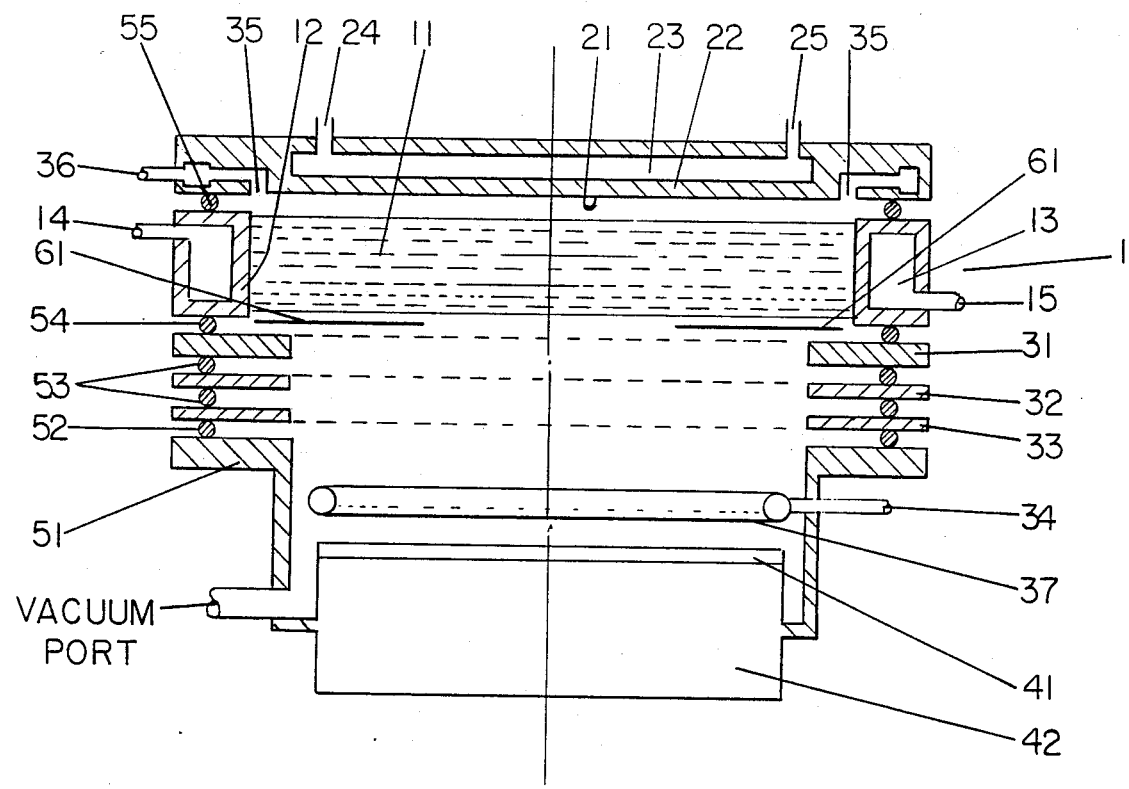
FIG. 1 is an illustration in cross-section of a microelectronics processing chamber containing a VUV lamp, constructed in accordance with one embodiment of the present invention, for producing a disc-shaped trapped electron beam plasma that emits VUV light and also acts as a dissociation source for atomic species created in the electron beam plasma region.

Referring now to FIG. 1, there is shown a cross-sectional pictorial representation of an in-situ, large area vacuum ultraviolet (VUV) lamp constructed in accordance with the present invention. The inner surface of a ring-shaped cold cathode 12 operating in the abnormal glow discharge state emits secondary electrons following ion bombardment, metastable impingement, or the absorption of a VUV photon. The secondary electrons are accelerated in the cathode sheath, thus providing a disc-shaped electron beam created plasma or discharge 11.

The disc-shaped trapped electron beam plasma 11 excites the surrounding ambient gas via energetic electron-atom or molecule collisions. For molecular $O_2$, $N_2$, $D_2$, and $H_2$ gases the disc-shaped trapped electron beam plasma acts as a large area circular source of atomic species and charged particles, as well as a large area source of atomic VUV resonance radiation. The excited atoms within the disc-shaped trapped electron beam plasma 11 will emit VUV radiation primarily on their resonance lines. Because of the narrow spatial width of the beam created plasma compared to conventional plasmas the resonant photon mean free path is comparable to the lamp plasma width rather than much less than this dimension. Hence, resonance trapping of photons is avoided and the resonance radiation can propagate to the substrate surface, far away from the spatially localized disc-shaped trapped electron beam plasma 11. A VUV reflective coating 21 is placed on one surface of a top cap 22 to direct the VUV backside radiation toward a substrate 41 that is held in a desired position by a temperature controllable support 42.

Cavities 13 and 23 within the ring-shaped cold cathode 1 and top cap 22, respectively, serve as coolant cavities through which water or a gas coolant may be circulated. The inlet ports 14, 24 and outlet ports 15, 25 are connected to a thermal circulator to remove the heat generated by discharge. Multiple auxiliary grid electrodes such as extraction grid electrode 31, retardation grid electrode 32 and bias grid electrode 33 are located between the ring-shaped cathode 1 and the substrate 41 to steer the charged particles generated in the electron beam created plasma 11 toward or away from the processed substrate surface depending on which is needed. This is accomplished by proper choice of the polarity of the applied potential between the three grid electrodes. These grid electrodes may be formed as a planar metal mesh, metal slot or annular metal ring. A plate 61 having a circular aperture in the center thereof is placed between the ring-shaped cathode 1 and the substrate 41 to shadow the cathode front surface 12 from the substrate 41 to reduce inadvertent cathode sputtering that could act as a contaminant. A series of insulator rings 52, 53, 54, 55 provide both electrical insulation and vacuum sealing. Gas port 36 and purging jets 35 provide a flow of input reactant gas to maintain a cleaner electron beam plasma 11 and to minimize any contaminated film deposition from the ring shaped cold cathode surface 12.

Figure 2:
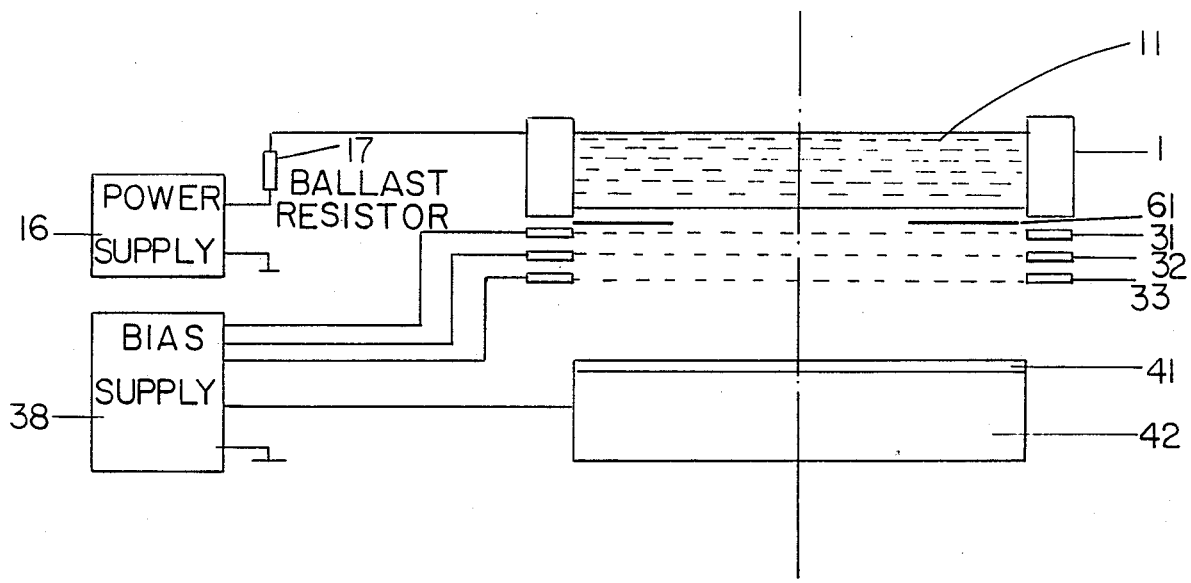
FIG. 2 is an illustration of the electrical connections for the in-situ VUV lamp of FIG. 1.

The ring-shaped cold cathode 1, illustrated in FIG. 2, acts to trap energetic electrons by electrostatic reflection. An external electrical potential is applied to the ring-shaped cold cathode 1 through a power supply 16, illustrated in FIG. 2. Materials from which the ring-shaped cold cathode 1 may be constructed are of a wide variety to meet the varying requirements of thin film processing including photo-assisted etching, photo-assisted deposition, and photon modification of both inorganic and polymer films. Any material that may be chosen for ring-shaped cold cathode 1, however, should have a high secondary electron emission coefficient to achieve high efficiency operation. A low sputtering yield for the selected cathode material is also desired or, alternatively, a cathode material which is not an impurity to the process being used. Suitable cathode materials may comprise heavily doped and lightly doped silicon, molybdenum, tantalum, aluminum, and graphite. A sintered metal-ceramic (CERMET) mixture of silicon and silicon dioxide, TiN and $ZrO_2$, magnesium and aluminum oxide or molybdenum and aluminum oxide is also suitable, as are calcium, strontium, and barium oxides and their mixtures.

The power supply 16 of FIG. 2 is connected to the ring-shaped cold cathode 1 and to the grounded vacuum chamber 51, which acts as the cold cathode abnormal glow discharge anode in conjunction with the cold cathode 12, shown in FIGS. 1 and 2, through a group of ballast resistors 17. The bias supply 38 of FIG. 2 is connected to extraction grid electrode 31, retardation grid electrode 32, bias grid electrode 33, temperature controllable support 42, and grounded vacuum chamber 51 to provide the required electrical power. If the in-situ VUV lamp of the present invention is operated in molecular $D_2$, $H_2$, $O_2$ or $N_2$, which is introduced into the vacuum chamber 1 through gas port 36 and purging jets 35, the disc-shaped trapped electron beam plasma 11 dissociates a fraction of the molecules into atomic species. The reaction gas species are introduced through gas port 34 and jets 37 toward the area near substrate 41.

The ground state atomic species that diffuse from the disc-shaped trapped electron beam plasma 11 toward the substrate 41 can be subsequently optically excited by resonance radiation originating from the disc-shaped trapped electron beam plasma 11 to form excited neutral atoms near the substrate 41. For example, D radiation at 121.5 nm, H radiation at 121.6 nm, O radiation at 130 nm, N radiation at 120 nm, and He radiation at 58 nm will resonantly excite ground state D, H, O, N, and He atomic species, respectively. Excited, rather than ground state atoms, participate in sensitized atom-molecule dissociation reactions in accordance with the expression A*+polyatomic→A+fragments. The photo-excited D(2p), H(2p), $O(1s^22s^22p^33s)$, He(1s2p) and $N(1s^22s^22p^23s)$ atoms can participate in sensitized atom-molecule volume reactions to dissociate reactant molecules as well as assist surface reaction in etching, deposition, and film modification sequences of both organic and inorganic films used in the microelectronic, photovoltaic, and electro-optic arts. In the case of assisting surface reactions, this is achieved with minimal surface damage since the kinetic energy of the atom species is gas kinetic unlike the case of accelerated ion bombardment.

We claim:

1. A wide area vacuum ultraviolet lamp comprising: vacuum chamber means;

a ring-shaped cold cathode within the vacuum chamber means having geometrically shaped inner surface comprising a material selected for the efficient emission of secondary electrons and for minimum cathode sputtering, the ring-shaped cold cathode having a cavity therein through which a coolant may be circulated;

D.C. power supply means electrically connected to the ring-shaped cold cathode and to the vacuum chamber means for accelerating secondary electrons emitted from the inner surface of the ring-shaped cold cathode to create a generally disc-shaped trapped electron beam discharge;

a substrate positioned within the vacuum chamber means, adjacent one side of the disc-shaped trapped electron beam discharge but outside the volume defined thereby, for receiving radiation from the disc-shaped trapped electron beam discharge;

a top cap coated with a VUV reflective layer, said top cap serving as a vacuum ultraviolet reflector positioned within the vacuum chamber means, adjacent a side of the disc-shaped trapped electron beam discharge opposite the substrate but outside the volume defined by the disc-shaped trapped electron beam discharge, for directing vacuum ultraviolet radiation toward the substrate, the vacuum ultraviolet relector having a cavity therein through which a coolant may be circulated;

an extraction grid electrode positioned within the vacuum chamber means and adjacent one side of the disc-shaped trapped electron beam discharge for directing a desirable type of charged particles created within the disc-shaped trapped electron beam discharge toward the substrate;

a retardation grid electrode positioned within the vacuum chamber means and adjacent the extraction grid electrode for retarding a flow of an undesirable type of charged particles created within the disc-shaped trapped electron beam discharge toward the substrate;

a bias grid electrode positioned within the vacuum chamber means and adjacent the substrate for providing an electrical field for steering of the desirable type of charged particles created within the disc-shaped trapped electron beam discharge toward the substrate;

a plate having a central aperture therein for protecting the substrate from contamination by cathode sputtering of impurities;

a plurality of purging jets positioned adjacent the inner surface of the ring-shaped cold cathode and also adjacent the periphery thereof for admitting one or more purging gases for preventing the deposition of a contaminated film onto the inner surface of the ring-shaped cold cathode and for continuous cleaning of the inner surface of the ring-shaped cold cathode;

vacuum control means coupled to the vacuum chamber means for establishing and maintaining a desired vacuum within said vacuum chamber means; and gas port means for admitting and controlling the flow of ambient and reactant gases into the vacuum chamber means.

2. A wide area vacuum ultraviolet lamp as in claim 1 wherein the one or more purging gases admitted through the plurality of purging jets comprises hydrogen.

3. A wide area vacuum ultraviolet lamp as in claim 1 wherein the one or more purging gases admitted through the plurality of purging jets comprises helium.

4. A wide area vacuum ultraviolet lamp as in claim 1 wherein the one or more purging gases admitted through the plurality of purging jets comprises a mixture of hydrogen and an inert gas.

5. A wide area vacuum ultraviolet lamp as in claim 1 wherein the one or more purging gases admitted through the plurality of purging jets comprises a mixture of oxygen and an inert gas.

6. A wide area vacuum ultraviolet lamp as in claim 1 wherein each of the extraction grid, retardation grid and bias grid electrodes comprises a planar metal mesh.

7. A wide area vacuum ultraviolet lamp as in claim 1 wherein each of the extraction grid, retardation grid and bias grid electrodes comprises a metal slot.

8. A wide area vacuum ultraviolet lamp as in claim 1 wherein each of the extraction grid, retardation grid and bias grid electrodes comprises an annular metal ring.

9. A wide area vacuum ultraviolet lamp as in claim 1 wherein the plate having a central aperture therein comprises stainless steel and is operative for protecting the substrate from the sputtering of material from the ring-shaped cold cathode.

10. A method for driving the chemical vapor deposition and native film growth by using a wide area vacuum ultraviolet lamp, the method comprising:

introducing a substrate to be coated into a vacuum chamber apparatus containing a wide area vacuum ultraviolet lamp having a ring-shaped cold cathode with a geometrically shaped inner surface comprising a material selected from the efficient emission of secondary electrons and for minimum cathode sputtering, having an extraction grid electrode, a retardation grid electrode, and a bias grid electrode positioned between said ring-shaped cathode and a substrate to be coated, having a plate with a central aperture therein for protecting the substrate from sputtering of material from the ring-shaped cold cathode, having a vacuum ultraviolet reflector positioned within the vacuum chamber means on an oppositie side of the ring-shaped cold cathode from the substrate, and having a plurality of purging jets positioned adjacent the inner face of the ring-shaped cold cathode;

establishing a controlled gas atmosphere of reactant gases within the vacuum chamber means;

introducing a purging gas through the plurality of purging jets;

applying operating voltages to the elements of the wide area vacuum ultraviolet lamp for accelerating secondary electrons emitted from the inner surface of the disc-shaped cold cathode to create a generally disc-shaped trapped electron beam discharge that includes vacuum ultraviolet photons and excited species for inducing chemical vapor deposition and native film growth on the substrate; and maintaining the temperature of the substrate within the range of 50 degrees C. to 1200 degrees C.

* * * * *